United States Patent
Kim et al.

(10) Patent No.: US 8,748,894 B2
(45) Date of Patent: Jun. 10, 2014

(54) COMPOSITION OF ORGANIC INSULATING LAYER AND THIN FILM TRANSISTOR SUBSTRATE AND DISPLAY DEVICE USING THE SAME

(71) Applicant: LG Display Co., Ltd., Seoul (KR)

(72) Inventors: Ju Hyuk Kim, Goyang-si (KR); Jin Wuk Kim, Goyang-si (KR); Joon Ki Kim, Seoul (KR); Na Young Song, Paju-si (KR); Jae Chul Hwang, Paju-si (KR); Song A Kim, Paju-si (KR); Min Ho Jang, Seoul (KR); Jeong Beom Park, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/665,668

(22) Filed: Oct. 31, 2012

(65) Prior Publication Data

US 2013/0134426 A1    May 30, 2013

(30) Foreign Application Priority Data

Nov. 30, 2011  (KR) .................. 10-2011-0126814

(51) Int. Cl.
*H01L 29/04* (2006.01)
*H01L 31/20* (2006.01)
*H01L 31/036* (2006.01)
*H01L 31/0376* (2006.01)

(52) U.S. Cl.
USPC ............................................. 257/59

(58) Field of Classification Search
USPC ........... 257/57, 59, 66, 72, E29.273; 438/689
See application file for complete search history.

(56) References Cited

U.S. PATENT DOCUMENTS

| | | | |
|---|---|---|---|
| 2005/0165146 A1* | 7/2005 | Ilda et al. | 524/356 |
| 2009/0030103 A1* | 1/2009 | Kang et al. | 522/75 |
| 2011/0117496 A1* | 5/2011 | Eriguchi et al. | 430/270.1 |
| 2013/0256653 A1* | 10/2013 | Ahn et al. | 257/43 |

* cited by examiner

*Primary Examiner* — Phuc Dang
(74) *Attorney, Agent, or Firm* — Birch, Stewart, Kolasch & Birch, LLP

(57) ABSTRACT

Discussed is a composition of an organic insulating layer comprising a photosensitizer, a binder, an additive and a solvent, wherein the photosensitizer includes a photoacid generator (PAG), and a thin film transistor substrate and display device using the same, wherein the composition of the present invention enables to realize a simplified process by omitting an additional entire-surface exposing process for a color change, and a baking process after an exposing process; and to minimize a problem of color-coordinates shift by realizing a good light transmittance.

13 Claims, 3 Drawing Sheets

COMPOSITION OF ORGANIC INSULATING LAYER AND THIN FILM TRANSISTOR SUBSTRATE AND DISPLAY DEVICE USING THE SAME

CROSS REFERENCE TO RELATED APPLICATIONS

This application claims the benefit of the Korean Patent Application No. 10-2011-0126814 filed on Nov. 30, 2011 in Republic of Korea, which is hereby incorporated by reference as if fully set forth herein.

BACKGROUND

1. Field of the Invention

The present invention relates to an insulating layer applied to a thin film transistor substrate, and more particularly, to a composition of an organic insulating layer.

2. Discussion of the Related Art

A thin film transistor is widely used as a switching element of a display device such as a liquid crystal display (LCD) or an organic light emitting display (OLED).

The thin film transistor comprises a gate electrode, an active layer, a source electrode and a drain electrode. Then, a passivation layer is formed on the thin film transistor.

Hereinafter, a related art thin film transistor substrate will be described with reference to the accompanying drawings.

FIG. 1 is a cross sectional view of a related art thin film transistor substrate. As shown in FIG. 1, a gate electrode 20 is formed on a substrate 10, and a gate insulating layer 30 is formed on the gate electrode 20.

Then, a semiconductor layer 40 is formed on the gate insulating layer 30, and a source electrode 52 and a drain electrode 54 are formed on the semiconductor layer 40, wherein the source electrode 52 and the drain electrode 54 are positioned opposite to each other.

A passivation layer 60 is formed on the source electrode 52 and the drain electrode 54, and a pixel electrode 70 is formed on the passivation layer 60. In this case, a predetermined contact hole (H) is formed in the passivation layer 60, whereby the pixel electrode 70 is electrically connected with the drain electrode 54 through the contact hole (H).

As mentioned above, the passivation layer 60 is formed on the thin film transistor, to thereby protect the thin film transistor. Generally, the passivation layer 60 for protecting the thin film transistor may be formed of an organic insulating layer.

The passivation layer 60 is patterned to have the predetermined contact hole (H). A process for patterning the passivation layer 60 comprises an exposing process using a predetermined mask, and a development process using a predetermined developing solution. That is, the exposing process is carried out through the use of predetermined mask, whereby a chemical reaction occurs in an exposed region of the passivation layer 60. Under these conditions, the development process is carried out, whereby the exposed region is removed by the developing solution due to different material properties between the exposed region and non-exposed region, thereby forming the contact hole (H).

It should be possible to pattern the contact hole (H) in the passivation layer 60. Thus, the organic insulating layer used for the passivation layer 60 comprises a photosensitizer capable of making the chemical reaction to the exposing process (to a light such as UV).

In case of the related art, the photosensitizer included in the organic insulating layer is typically formed of a photoactive compound (PAC).

However, if using the photoactive compound (PAC) as the photosensitizer, it has the following disadvantages.

First, in order to form a fine pattern, that is, in order to form the contact hole (H) with a precise pattern, when using the photoactive compound (PAC) as the photosensitizer, it is necessary to additionally carry out a baking process for applying a predetermined heat between the exposing process and the development process.

That is, since the photoactive compound (PAC) has low reactivity to the exposing process, the baking process is additionally carried out after the exposing process, whereby the entire regions are clearly divided into the region to be removed by the following development process, and the region not to be removed.

Also, the photoactive compound (PAC) has a yellow color. Thus, if using the photoactive compound (PAC), it might lower a light transmittance of a display device and cause a problem of color-coordinates shift.

Meanwhile, when the photoactive compound (PAC) is irradiated with ultraviolet rays (UV), its yellow color is changed into a white color so that it is possible to improve the light transmittance. However, for this, an entire-surface exposing process has to be additionally carried out. Further, even though the yellow color is changed into the white color by the entire-surface exposing process, it is difficult to obtain the high-level light transmittance.

As described above, if using the photoactive compound (PAC) as the photosensitizer, the light transmittance of the display device is deteriorated, and an entire manufacturing process is complicated due to the additional processes such as the baking process and entire-surface exposing process.

SUMMARY

Accordingly, the present invention is directed to a composition of an organic insulating layer, and a thin film transistor using the same, and a display device using the same that substantially obviates one or more problems due to limitations and disadvantages of the related art.

An aspect of the present invention is to provide a composition of an organic insulating layer which includes a photosensitizer enabling to form a pattern of a passivation layer by a simplified process and to improve a light transmittance, a thin film transistor substrate using the above composition, and a display device including the above thin film transistor substrate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a composition of an organic insulating layer comprising a photosensitizer, a binder, an additive and a solvent, wherein the photosensitizer includes a photoacid generator (PAG).

In another aspect of the present invention, there is provided a thin film transistor substrate comprising: a substrate; a thin film transistor on the substrate, the thin film transistor including a gate electrode, a gate insulating layer, a semiconductor layer, and source and drain electrodes; and a passivation layer for protecting the thin film transistor, wherein the passivation layer is formed by using a composition of an organic insulating layer including a photosensitizer, a binder, an additive and a solvent, wherein the photosensitizer includes a photoacid generator (PAG), and the photoacid generator (PAG) is a compound expressed in the following chemical formula 1,

[Chemical Formula 1]

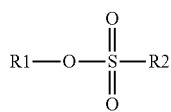

wherein, R1 is one selected from the group consisting of ester group, ether group, thioether group, amide group and carbonate group, wherein the carbon number of each group is not more than 20, and R2 is hydrocarbon whose carbon number is not more than 12.

In another aspect, of the present invention, there is provided a display device comprising a thin film transistor substrate, wherein the thin film transistor substrate includes: a substrate; a thin film transistor on the substrate, the thin film transistor including a gate electrode, a gate insulating layer, a semiconductor layer, and source and drain electrodes; and a passivation layer for protecting the thin film transistor, wherein the passivation layer is formed by using a composition of an organic insulating layer including a photosensitizer, a binder, an additive and a solvent, wherein the photosensitizer includes a photoacid generator (PAG), and the photoacid generator (PAG) is a compound expressed in the following chemical formula 1,

[Chemical Formula 1]

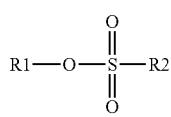

wherein, R1 is one selected from the group consisting of ester group, ether group, thioether group, amide group and carbonate group, wherein the carbon number of each group is not more than 20, and R2 is hydrocarbon whose carbon number is not more than 12.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
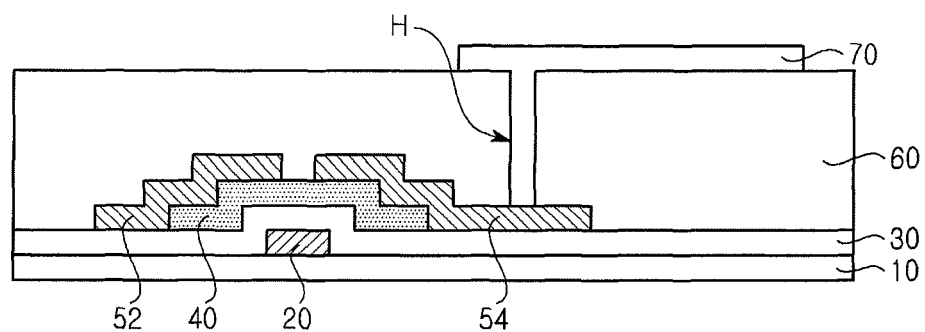
FIG. 1 is a cross sectional view of a related art thin film transistor substrate.

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a composition of an organic insulating layer according to the embodiment of the present invention will be described with reference to the accompanying drawings.

A composition of an organic insulating layer according to one embodiment of the present invention comprises a photosensitizer, a binder, an additive and a solvent.

The photosensitizer is provided to facilitate a pattern formation in the organic insulating layer through a chemical reaction by an exposing process. The photosensitizer according to one embodiment of the present invention includes a photoacid generator (PAG).

The photoacid generator (PAG) has a white color instead of a yellow color shown in a related art photoactive compound (PAC). Thus, in case of the present invention, it is unnecessary to additionally carry out an entire-surface exposing process to make a color change from yellow to white, thereby realizing a simplified process in comparison with the related art.

Also, the photoacid generator (PAG) according to the present invention has high reactivity to the exposing process. Thus, in case of the present invention, it is unnecessary to additionally carry out a baking process after the exposing process, thereby realizing a simplified process in comparison with the related art.

Also, a light transmittance of the photoacid generator (PAG) according to the present invention is greater than that of the photoactive compound (PAC) whose color is changed to the white through the exposing process, to thereby obtain the improved light transmittance in comparison with the related art.

The photoacid generator (PAG) may comprise a compound expressed in the following chemical formula 1.

[Chemical Formula 1]

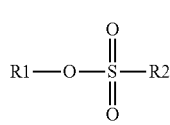

In the above chemical formula 1, R1 is one selected from the group consisting of ester group, ether group, thioether group, amide group and carbonate group, wherein the carbon number of each group is not more than 20. Especially, R1 may be monovalent hydrocarbon with an aromatic hydrocarbon structure. R1 may be monovalent hydrocarbon with a cycloaliphatic hydrocarbon structure whose carbon number is not less than 5.

In the above chemical formula 1, R2 is hydrocarbon whose carbon number is not more than 12. Especially, R2 may be n-propyl or n-octyl.

For example, the compound expressed in the above chemical formula 1 may be 2-(((4-METHYLPHENYL)SULFO-NYL)OXY)-1H-BENZO(DE)(ISOQUINOLINE)-1,3(2H)-DIONE, TOLUENE-4-SULFONIC ACID 6-MEO-1,3-DIOXO-1H,3H-BENZO(DE)ISOQUINOLIN-2-YL ESTER, or N,N-DIMETHYL-2-{[(2-METHYLPHENYL) SULFONYL]OXY}-1,3-DIOXO-2,3-DIHYDRO-1H-BENZO[DE]ISOQUINOLINE-5-SULFONAMIDE, but it is not limited to the above.

The photosensitizer including the photoacid generator (PAG) may be included within a range of 0.1 to 5 weight % of the entire composition of the organic insulating layer. If the photosensitizer is less than 0.1 weight %, a patterning process for the organic insulating layer might be unsmooth. Meanwhile, if the photosensitizer is more than 5 weight %, the mechanical characteristics of the organic insulating layer might be deteriorated.

The binder is provided to improve the mechanical characteristics of the organic insulating layer. The binder according to one embodiment of the present invention may be acryl-based binder.

The acryl-based binder may be formed of various kinds of acryl-based polymer generally known to those in the art.

The binder may be included within a range of 5 to 30 weight % of the entire composition of the organic insulating layer. If the binder is less than 5 weight %, the mechanical characteristics of the organic insulating layer might be deteriorated. Meanwhile, if the binder is more than 30 weight %, the coating and patterning processes for the organic insulating layer might be unsmooth.

The additive may comprise at least one selected from a curing agent, a plasticizer, an adhesion-promoting agent and a surfactant.

The curing agent may comprise melamine-based or ethylene-based polymer. The ethylene-based polymer used for the curing agent may be ethylene glycol di(metha)acrylate, but not necessarily.

The plasticizer may comprise phtalate-based polymer, but not necessarily.

The adhesion-promoting agent may comprise silane-based polymer, but not necessarily.

The surfactant may comprise siloxane-based polymer, but not necessarily.

The additive may be included within a range of 0.01 to 5 weight % of the entire composition of the organic insulating layer. If the additive is less than 0.01 weight %, it may not be easy to realize the function of additive. Meanwhile, if the additive is more than 5 weight %, the mechanical characteristics of the organic insulating layer might be deteriorated, or the patterning process for the organic insulating layer might be unsmooth.

The solvent may be various kinds of organic solvent generally known to those in the art, for example, propylene glycol methyl ether acetate (PGMEA).

The solvent may be included within a range of 60 to 90 weight % of the entire composition of the organic insulating layer. If the solvent is less than 60 weight % or more than 90 weight %, the coating process for the organic insulating layer might be unsmooth.

Hereinafter, the color and light transmittance characteristics in the composition of the organic insulating layer according to one example of the invention will be described with reference to the detailed experimental examples.

First, the composition of the organic insulating layer according to the example of the present invention and the composition of the organic insulating layer according to the comparative example are prepared as shown in the following Table 1.

TABLE 1

|  | Example of the present invention | Comparative example |
| --- | --- | --- |
| Photosensitizer | PAG (2.5 weight %) | PAC (2.5 weight %) |
| Binder | Acryl-based binder (15 weight %) | Acryl-based binder (15 weight %) |
| Additive | Melamine-based curing agent (2.5 weight %) | Melamine-based curing agent (2.5 weight %) |
| solvent | PGMEA (80 weight %) | PGMEA (80 weight %) |

In the above Table 1, PAG used in the example of the present invention is 2-(((4-METHYLPHENYL)SULFO-NYL)OXY)-H-BENZO(DE)ISOQUINOLINE-1,3(2H)-DI-ONE.

In the above Table 1, PAC used as the photosensitizer in the comparative example is formed of a material expressed in the following chemical formula 2.

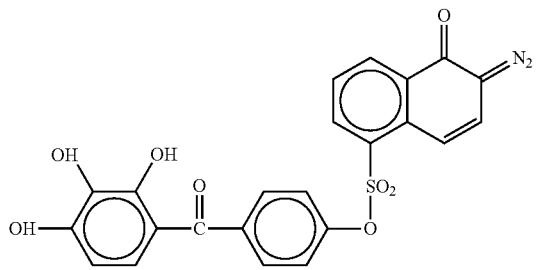

[Chemical formula 2]

In the above Table 1, the acryl-based binder used as the binder in the example of the present invention and the comparative example is formed of a material expressed in the following chemical formula 3.

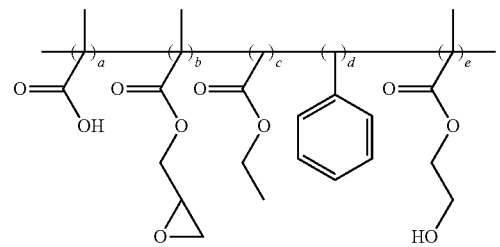

[Chemical formula 3]

In the above chemical formula 3, each of a, b, c, d and e is an integer which is not less than 1.

The following Table 2 shows a yellow index in the composition of the organic insulating layer prepared according to the example of the present invention, and a yellow index in the composition of the organic insulating layer prepared according to the comparative example.

In this case, the yellow index in the composition of the organic insulating layer prepared according to the example of the present invention is measured under the condition that the entire-surface exposing process is not carried out. Meanwhile, the yellow index in the composition of the organic insulating layer prepared according to the comparative example is measured after carrying out the entire-surface exposing process.

TABLE 2

|  | Example of the present invention | Comparative example |
|---|---|---|
| Yellow index (ASTM D1925) | 15.5 | 16.6 |
| Yellow index (ASTM E313) | 21.9 | 23.2 |

As shown in the above Table 2, the yellow index in the composition of the organic insulating layer according to the example of the present invention is smaller than that of the comparative example. Especially, in case of the example of the present invention, the yellow index (ASTM D1925) is not more than 16, and the yellow index (ASTM E313) is not more than 22.

As known from the above results, it has been shown that the PAG of the present invention is whiter than the related art PAC.

Figure 2:
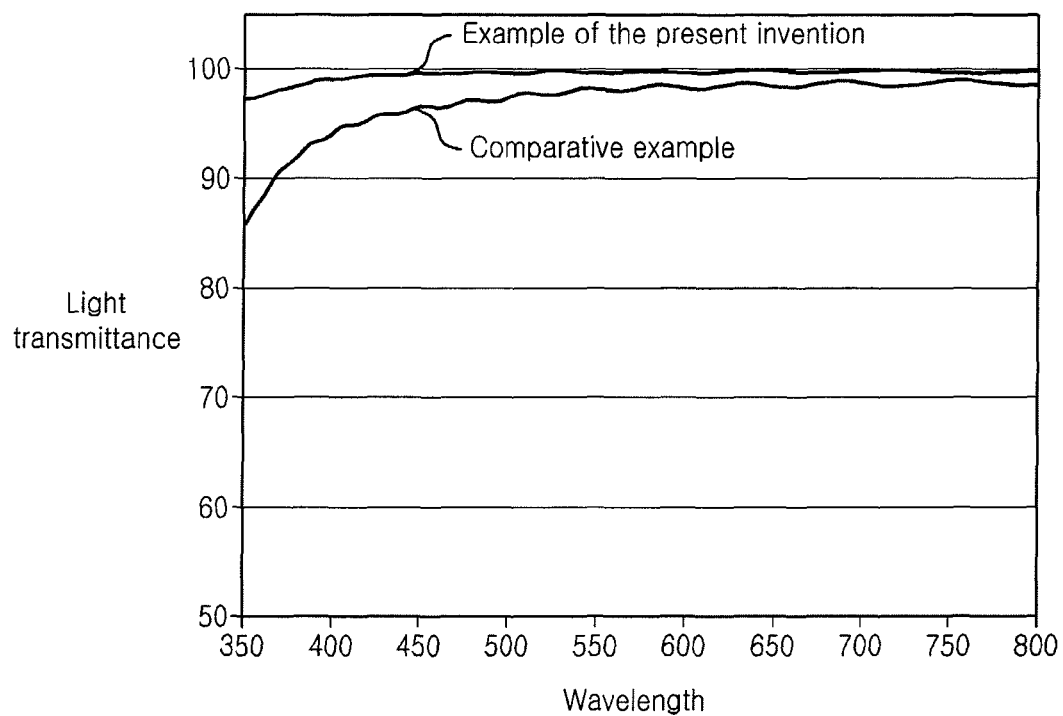
FIG. 2 is a graph illustrating a light transmittance in a composition of an organic insulating layer prepared according to the example of the present invention, and a light transmittance in a composition of an organic insulating layer prepared according to a comparative example.

FIG. 2 is a graph illustrating a light transmittance in the composition of the organic insulating layer prepared by the example of the present invention, and a light transmittance in the composition of the organic insulating layer prepared by the comparative example.

In the same manner as the yellow index of the above Table 2, the light transmittance in the composition of the organic insulating layer prepared by the example of the present invention is measured under the condition that the entire-surface exposing process is not carried out, and the light transmittance in the composition of the organic insulating layer prepared by the comparative example is measured after carrying out the entire-surface exposing process.

As shown in FIG. 2, under the condition of 400 nm wavelength, while the light transmittance in the composition of the organic insulating layer prepared by the example of the present invention is 99.06, the light transmittance in the composition of the organic insulating layer prepared by the comparative example is 94.25.

Also, under the condition of 380~780 wavelength, while an average value of the light transmittance in the composition of the organic insulating layer prepared by the example of the present invention is 99.51, an average value of the light transmittance in the composition of the organic insulating layer prepared by the comparative example is 97.09.

Hereinafter, thin film transistor substrates according to various embodiments of the present invention, which is applied with the composition of the organic insulating layer according to one embodiment of the present invention, will be described as follows.

Figure 3:
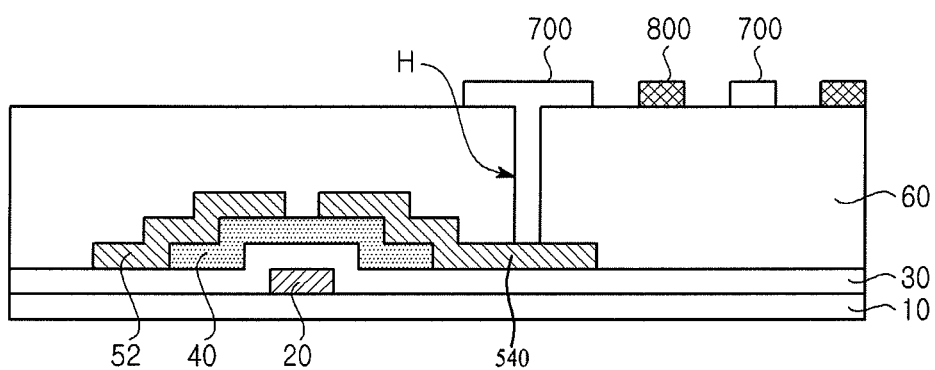
FIG. 3 is a cross sectional view of a thin film transistor substrate according to one embodiment of the present invention.

FIG. 3 is a cross sectional view of a thin film transistor substrate according to one embodiment of the present invention.

Referring to FIG. 3, a gate electrode 200 is patterned on a substrate 100, and a gate insulating layer 300 is formed on the gate electrode 200.

Then, a semiconductor layer 400 is patterned on the gate insulating layer 300. Also, source and drain electrodes 520 and 540 are formed on the semiconductor layer 400 while being opposite to each other.

A structure where the gate electrode 200 is formed below the semiconductor layer 400 is referred to as a bottom gate structure. However, the present invention is not limited to the bottom gate structure. The present invention may be applied to a top gate structure where the gate electrode 200 is formed above the semiconductor layer 400.

A passivation layer 600 is patterned on the source and drain electrodes 520 and 540.

A process for patterning the passivation layer 600 comprises coating the aforementioned composition of the organic insulating layer; and forming a contact hole (H) to expose a predetermined portion of the drain electrode 540 by exposing the coated composition to a light such as an UV through the use of a predetermined mask, and developing the exposed one through the use of a predetermined developing solution.

According to the present invention, the photosensitizer for the organic insulating layer is formed of the photoacid generator (PAG). Thus, it is unnecessary for the process of the present invention to carry out the baking process and entire-surface exposing process according to the related art.

On the passivation layer 600, there are pixel electrode 700 and common electrode 800 arranged alternately.

The pixel electrode 700 is electrically connected with the drain electrode 540 through the contact hole (H).

The pixel electrode 700 and common electrode 800 are arranged in parallel, to thereby form an In-Plane type electric field therebetween. Accordingly, an alignment of liquid crystal can be controlled through the use of In-Plane type electric field. The thin film transistor substrate of FIG. 3 may be applied to an In-Plane Switching (IPS) mode LCD device.

If the passivation layer for protecting the thin film transistor is formed of the aforementioned composition of the organic insulating layer according to one embodiment of the present invention, the thin film transistor substrate according to the present invention may include various types of thin film transistor substrates generally known to those in the art, which are capable of being applied to any IPS mode LCD device as well as the structure shown in FIG. 3.

Figure 4:
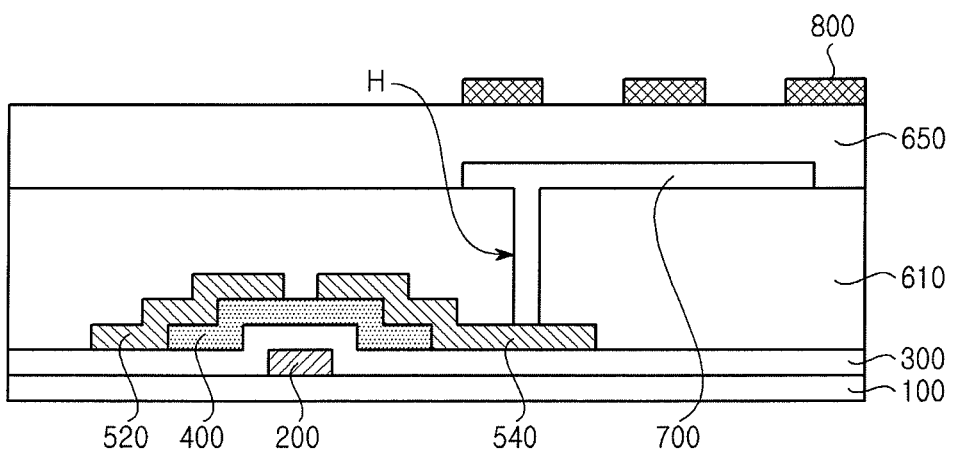
FIG. 4 is a cross sectional view of a thin film transistor substrate according to another embodiment of the present invention.
Figure 5:
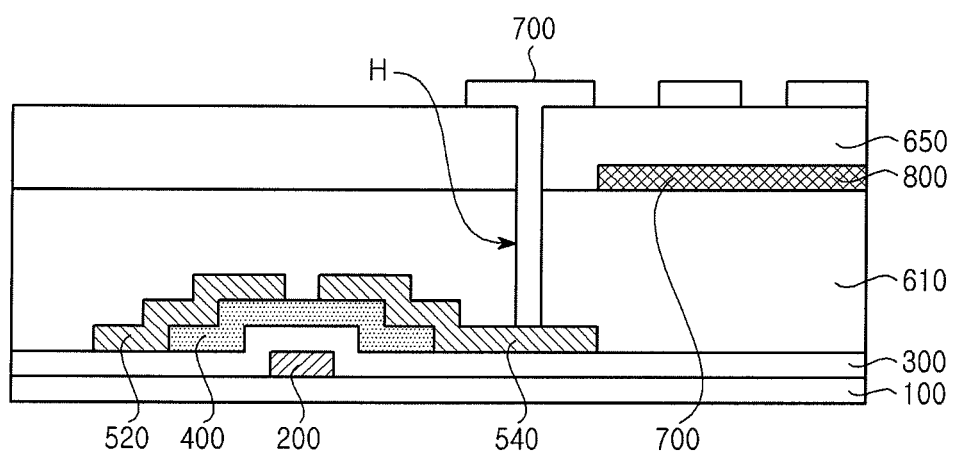
FIG. 5 is a cross sectional view of a thin film transistor substrate according to another embodiment of the present invention.

FIG. 4 is a cross sectional view of a thin film transistor substrate according to another embodiment of the present invention. FIG. 5 is a cross sectional view of a thin film transistor substrate according to another embodiment of the present invention. These thin film transistor substrates are applied to a Fringe Field Switching (FFS) mode LCD device.

Referring to FIGS. 4 and 5, a gate electrode 200 is patterned on a substrate 100, and a gate insulating layer 300 is formed on the gate electrode 200. Then, a semiconductor layer 400 is patterned on the gate insulating layer 300. Also, source and drain electrodes 520 and 540 are formed on the semiconductor layer 400 while being opposite to each other. Also, a first passivation layer 610 having a contact hole (H) is formed on the source and drain electrodes 520 and 540.

Referring to FIG. 4, a pixel electrode 700 is patterned on the first passivation layer 610, wherein the pixel electrode 700 is electrically connected with the drain electrode 540 through the contact hole (H). Then, a second passivation layer 650 is formed on the pixel electrode 700, and a common electrode 800 having a predetermined slit is patterned on the second passivation layer 650.

Referring to FIG. 5, a common electrode 800 is patterned on the first passivation layer 610, and a second passivation layer 650 having the contact hole (H) is formed on the common electrode 800. On the second passivation layer 650, there is a pixel electrode 700 electrically connected with the drain electrode 540 through the contact hole (H). The pixel electrode 700 of FIG. 5 is patterned to have a predetermined slit.

The thin film transistor substrate shown in FIGS. 4 and 5 is provided with the pixel electrode 700 and common electrode 800 formed at different layers, wherein the slit is formed in any one of the pixel electrode 700 and common electrode 800, to thereby form a fringe field between the pixel electrode 700 and common electrode 800 through the slit. Thus, it can be applied to the FFS mode LCD device where the liquid crystal is driven by the fringe field.

In the thin film transistor substrate shown in FIGS. 4 and 5, at least any one of the first passivation layer 610 and second passivation layer 650 may be formed of the aforementioned composition of the organic insulating layer according to one embodiment of the present invention.

If the passivation layer for protecting the thin film transistor is formed of the aforementioned composition of the organic insulating layer according to one embodiment of the present invention, the thin film transistor substrate according to the present invention may include various types of thin film transistor substrates generally known to those in the art, which are capable of being applied to any FFS mode LCD device as well as the structure shown in FIGS. 4 and 5.

The above description relates with the IPS mode and FFS mode thin film transistor substrates. However, the thin film transistor substrate according to the present invention may include the thin film transistor substrates using the composition of the organic insulating layer as the passivation layer, which are applied to the various modes of LCD devices generally known to those in the art, for example, Twisted Nematic (TN) mode, Vertical Alignment (VA) mode, and etc.

Also, the present invention may include the liquid crystal display (LCD) device or organic light emitting display (OLED) device comprising the various types of thin film transistor substrates mentioned above.

The LCD device according to one embodiment of the present invention includes the aforementioned thin film transistor substrate, another substrate confronting with the thin film transistor substrate, and a liquid crystal layer formed between the two substrates. Herein, another substrate confronting the thin film transistor substrate may comprise a color filter and black matrix, wherein a detailed structure thereof will be changed to various types generally known to those in the art.

The OLED according to one embodiment of the present invention may include an additional light-emitting device on the aforementioned thin film transistor substrate. This light-emitting device may be formed in a deposition structure where a hole injection layer, a hole transport layer, a light-emitting layer, an electron transport layer and an electron injection layer are sequentially deposited. Herein, it is possible to omit one or more layers among the hole injection layer, the hole transport layer, the electron transport layer and the electron injection layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A composition of an organic insulating layer comprising a photosensitizer, a binder, an additive and a solvent, wherein the photosensitizer includes a photoacid generator (PAG), wherein the photoacid generator (PAG) is formed of a compound expressed as the following chemical formula 1,

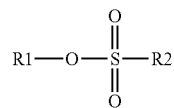

wherein, R1 is one selected from the group consisting of ester group, ether group, thioether group, amide group and carbonate group, wherein the carbon number of each group is not more than 20, and R2 is hydrocarbon whose carbon number is not more than 12.

2. The composition according to claim 1, wherein the R1 is monovalent hydrocarbon with an aromatic hydrocarbon structure, or monovalent hydrocarbon with a cycloaliphatic hydrocarbon structure whose carbon number is not less than 5, and the R2 is n-propyl or n-octyl.

3. The composition according to claim 1, wherein the photosensitizer is formed of 2-(((4-METHYLPHENYL)SULFONYL)OXY)-1H-BENZO(DE)(ISOQUINOLINE)-1,3 (2H)-DIONE, TOLUENE-4-SULFONIC ACID 6-MEO-1,3-DIOXO-1H,3H-BENZO(DE)ISOQUINOLIN-2-YL ESTER, or N,N-DIMETHYL-2-{[(2-METHYLPHENYL)SULFONYL]OXY}-1,3-DIOXO-2,3-DIHYDRO-1H-BENZO[DE]ISOQUINOLINE-5-SULFONAMIDE.

4. The composition according to claim 1, wherein the binder includes acryl-based polymer.

5. The composition according to claim 1, wherein the additive includes at least one selected from a curing agent, a plasticizer, an adhesion-promoting agent and a surfactant.

6. The composition according to claim 1,
wherein the photosensitizer is included within a range of 0.1 to 5 weight % of the entire composition of the organic insulating layer;
the binder is included within a range of 5 to 30 weight % of the entire composition of the organic insulating layer;
the additive is included within a range of 0.01 to 5 weight % of the entire composition of the organic insulating layer; and
the solvent is included within a range of 60 to 90 weight % of the entire composition of the organic insulating layer.

7. A thin film transistor substrate comprising:
a substrate;
a thin film transistor on the substrate, the thin film transistor including a gate electrode, a gate insulating layer, a semiconductor layer, and source and drain electrodes; and
a passivation layer for protecting the thin film transistor, wherein the passivation layer is formed by using a composition of an organic insulating layer including a photosensitizer, a binder, an additive and a solvent,
wherein the photosensitizer includes a photoacid generator (PAG), and the photoacid generator (PAG) is a compound expressed in the following chemical formula 1,

[Chemical Formula 1]

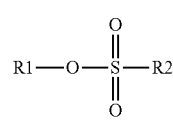

wherein, R1 is one selected from the group consisting of ester group, ether group, thioether group, amide group and carbonate group, wherein the carbon number of each group is not more than 20, and R2 is hydrocarbon whose carbon number is not more than 12.

8. The thin film transistor substrate according to claim 7, wherein the R1 is monovalent hydrocarbon with an aromatic hydrocarbon structure, or monovalent hydrocarbon with a cycloaliphatic hydrocarbon structure whose carbon number is not less than 5, and the R2 is n-propyl or n-octyl.

9. The thin film transistor substrate according to claim 7, wherein the photosensitizer is formed of 2-(((4-METHYLPHENYL)SULFONYL)OXY)-1H-BENZO(DE)(ISOQUINOLINE)-1,3(2H)-DIONE, TOLUENE-4-SULFONIC ACID 6-MEO-1,3-DIOXO-1H,3H-BENZO(DE)ISOQUINOLIN-2-YL ESTER, or N,N-DIMETHYL-2-{[(2-METHYLPHENYL)SULFONYL]OXY}-1,3-DIOXO-2,3-DIHYDRO-1H-BENZO[DE]ISOQUINOLINE-5-SULFONAMIDE.

10. The thin film transistor substrate according to claim 7, wherein the binder includes acryl-based polymer.

11. The thin film transistor substrate according to claim 7, wherein the additive includes at least one selected from a curing agent, a plasticizer, an adhesion-promoting agent and a surfactant.

12. The thin film transistor substrate according to claim 7,
wherein the photosensitizer is included within a range of 0.1 to 5 weight % of the entire composition of the organic insulating layer;
the binder is included within a range of 5 to 30 weight % of the entire composition of the organic insulating layer;
the additive is included within a range of 0.01 to 5 weight % of the entire composition of the organic insulating layer; and
the solvent is included within a range of 60 to 90 weight % of the entire composition of the organic insulating layer.

13. A display device comprising a thin film transistor substrate,
wherein the thin film transistor substrate includes:
a base substrate;
a thin film transistor on the base substrate, the thin film transistor including a gate electrode, a gate insulating layer, a semiconductor layer, and source and drain electrodes; and
a passivation layer for protecting the thin film transistor,
wherein the passivation layer is formed by using a composition of an organic insulating layer including a photosensitizer, a binder, an additive and a solvent,
wherein the photosensitizer includes a photoacid generator (PAG), and the photoacid generator (PAG) is a compound expressed in the following chemical formula 1,

[Chemical Formula 1]

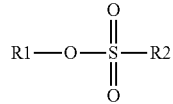

wherein, R1 is one selected from the group consisting of ester group, ether group, thioether group, amide group and carbonate group, wherein the carbon number of each group is not more than 20, and R2 is hydrocarbon whose carbon number is not more than 12.

* * * * *